United States Patent
Storino et al.

[19]

[11] Patent Number: 6,084,810
[45] Date of Patent: Jul. 4, 2000

[54] DYNAMIC LOGIC CIRCUIT WITH BITLINE REPEATER CIRCUIT

[75] Inventors: Salvatore N. Storino; Gregory John Uhlmann, both of Rochester, Minn.

[73] Assignee: International Business Machines Corporation, Armonk, N.Y.

[21] Appl. No.: 09/233,268

[22] Filed: Jan. 19, 1999

[51] Int. Cl.[7] .................................................. G11C 7/00
[52] U.S. Cl. ........................................ 365/204; 365/227
[58] Field of Search .................................... 365/204, 227

[56] References Cited

U.S. PATENT DOCUMENTS

| | | | |
|---|---|---|---|
| 5,440,182 | 8/1995 | Dobbelaere | 326/38 |
| 5,455,521 | 10/1995 | Dobbelaere | 376/17 |
| 5,576,649 | 11/1996 | Foss | 327/111 |
| 5,724,304 | 3/1998 | Foss | 365/230.06 |
| 5,768,186 | 6/1998 | Ma | 365/185.01 |
| 5,774,411 | 6/1998 | Hsieh et al. | 365/230.06 |

OTHER PUBLICATIONS

"Principles of CMOS VLSI Design, A Systems Perspective", by Neil H. E. Weste and Kamran Eshraghian, 1993, pp. 301–302, and 308–310.

*Primary Examiner*—David Nelms
*Assistant Examiner*—M. Tran
*Attorney, Agent, or Firm*—Joan Pennington

[57] ABSTRACT

A dynamic logic circuit is provided. The dynamic logic circuit includes at least one bitline. At least one repeater circuit is inserted into each bitline. The bitline repeater circuit includes an inverter and at least one transistor. The inverter is activated by the bitline starting to discharge and the activated inverter turns on the bitline repeater circuit transistor which discharges the bitline. The dynamic logic circuit including the bitline repeater circuit provides improved performance and decreased power consumption.

8 Claims, 3 Drawing Sheets

DYNAMIC LOGIC CIRCUIT WITH BITLINE REPEATER CIRCUIT

FIELD OF THE INVENTION

The present invention relates to dynamic logic circuits, and more particularly to, an improved dynamic logic circuit including a bit line repeater circuit.

DESCRIPTION OF THE RELATED ART

Generally, most arrays are dimensioned in notation m×n where m is the number of precision bits and n is the number of words. That is m×n array includes n words of m bits. More specifically, an array is constructed with a bitline concept. A bitline is viewed as a vector and a set of bitlines (vectors) compose an array. So, an m×n array is composed of m set of bitlines or vectors n×1. Bitlines operate by selecting only one out of n words. FIG. 1 is an example of a bitline where only one select from (S1 to S32) is chosen per access. If the corresponding data is high (D1 to D32) then the bitline is discharged. In the example shown n is 32 but m is not specified.

Notice in the FIG. 1 the network node labeled BITLINE has a large C associated with it, this represents its capacitance. Also transistors N1A and N1B have a large resistance R associated with it, this represents their resistance. The delay for discharging the bitline is proportional to the time constant delay=2 RC, since the capacitance C is discharged via the two series connected field effect transistors (FETS) N1A and N1B providing 2R. Also, the power dissipation is $\frac{1}{2}CV^2$, where C is the bitline capacitance.

A conventional or prior art solution to increasing performance is to increase transistor sizes. It is desirable to reduce the effective bitline capacitance C and the discharge path resistance 2R. In so doing, it also is desirable to preserve the original physical size and wireability. In addition to increasing performance it would be very advantageous to reduce power.

SUMMARY OF THE INVENTION

A principal object of the present invention is to provide an improved dynamic logic circuit. Other objects are to provide such dynamic logic circuit substantially without negative effects and that overcome many of the disadvantages of prior art arrangements.

In brief, a dynamic logic circuit is provided. The dynamic logic circuit includes at least one bitline. At least one repeater circuit is inserted into each bitline.

In accordance with features of the invention, the bitline repeater circuit includes an inverter and at least one transistor. The inverter is activated by the bitline starting to discharge and the activated inverter turns on the bitline repeater circuit transistor which discharges the bitline. The dynamic logic circuit including the bitline repeater circuit provides improved performance and decreased power consumption.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 2A:
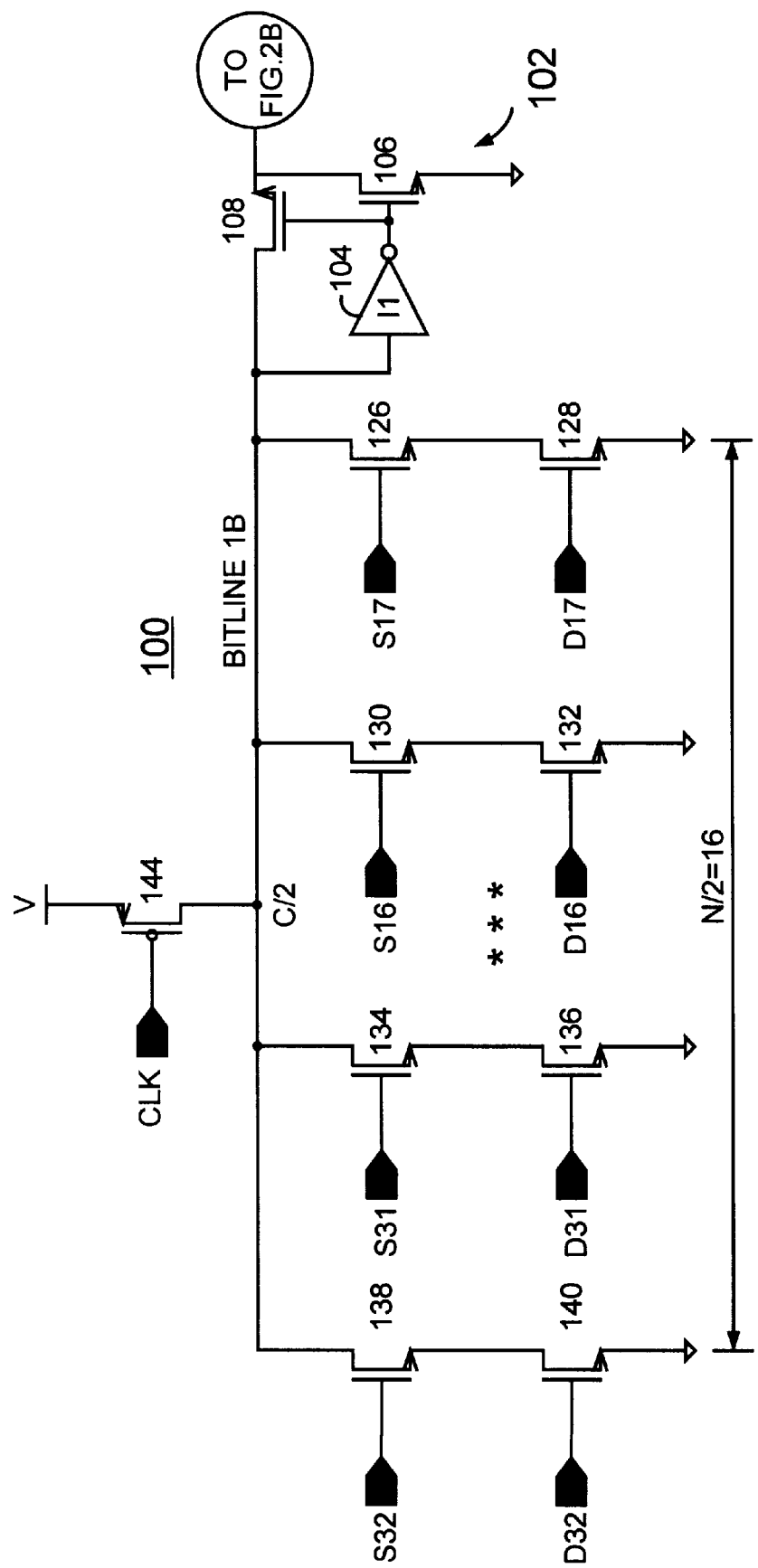
FIGS. 2A and 2B together provide a schematic diagram representation of a dynamic bitline circuit including a bitline repeater circuit in accordance with the present invention.
Figure 2B:
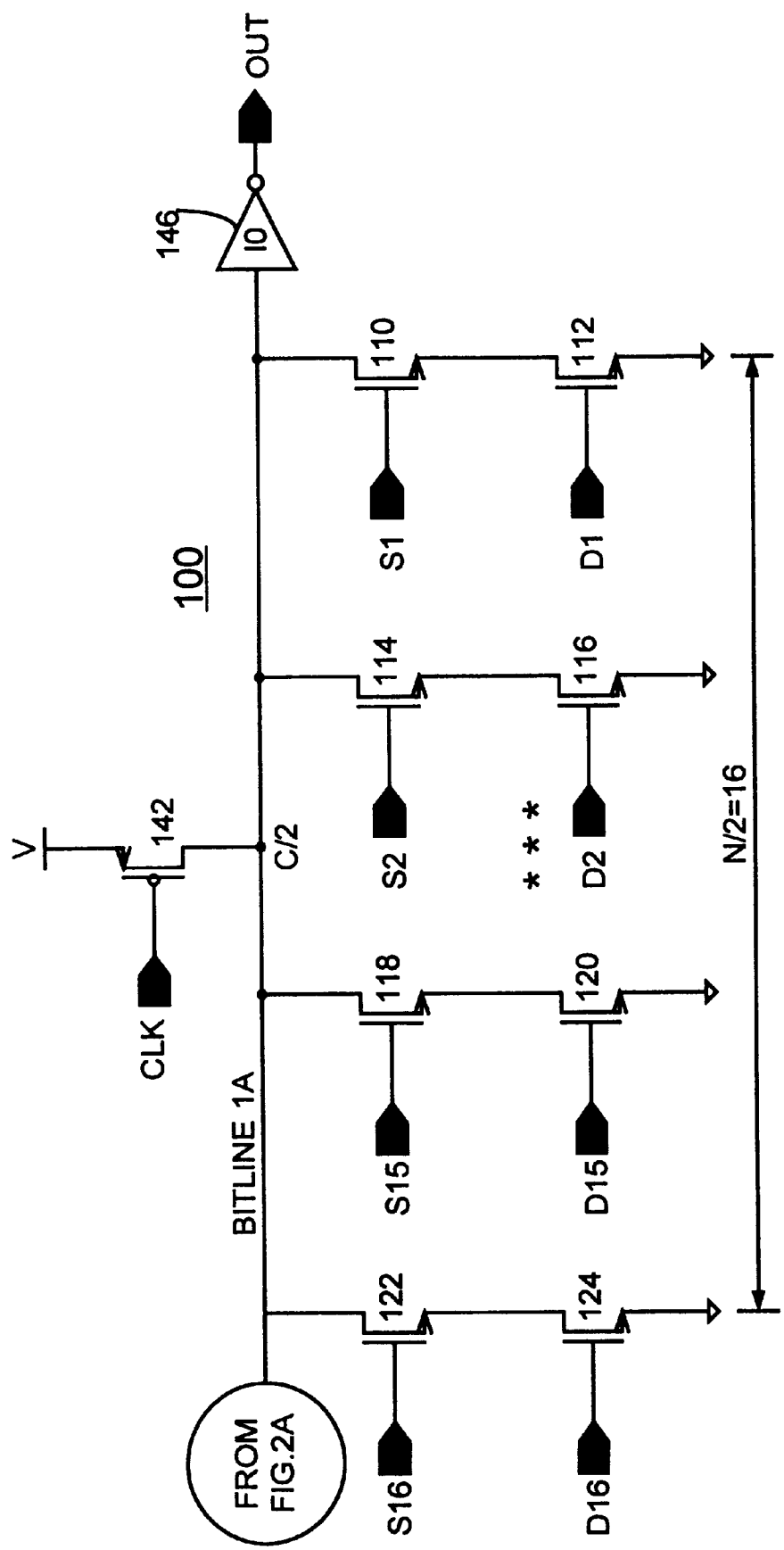

Having reference now to the drawing, FIGS. 2A and 2B illustrate a dynamic bitline circuit including a bitline repeater circuit generally designated by the reference character 100 in accordance with the present invention. Dynamic bitline circuit 100 includes a bitline repeater circuit generally designated by the reference character 102 in accordance with the present invention. As shown in FIGS. 2A and 2B, bitline repeater circuit 102 splits the bitline into BITLINE 1A and BITLINE 1B, while a single wiring track is maintained. As shown in FIGS. 2A and 2B, bitline repeater circuit 102 is inserted in the center of each bitline. It should be understood that the bitline repeater circuit 102 can be inserted at a selected interval of each bitline. For example, rather than including one bitline repeater circuit 102 in the center; two bitline repeater circuits 102 could be inserted in each bitline. Bitline repeater circuit 102 costs very little in overhead. The bitline repeater circuit 102 consists of inverter I1, 104 and a pair of field effect transistors (FETS) 106 and 108. The second FET 108 is optional.

Dynamic logic circuit 100 includes a plurality of pairs of series N-channel field effect transistors (FETs) 110, 112, 114, 116, 118, 120, 122, 124 connected between BITLINE 1A and ground. A respective select input S1, S16 is applied to a gate input of the first NFET 110, 114, 118, 122, each having the drain connected to the BITLINE 1A. A respective data input D1, D16 is applied to a gate input of the second NFET 112, 116, 120, 124, each having the drain connected to the source of the respective first NFET 110, 114, 118, 122 and each having the source connected to ground.

Dynamic logic circuit 100 similarly includes a plurality of pairs of series N-channel field effect transistors (FETs) 126, 128, 130, 132, 134, 136, 138, 140 connected between BITLINE 1B and ground. A respective select input S17, S32 is applied to a gate input of the first NFET 126, 130, 134, 138, each having the drain connected to the BITLINE 13. A respective data input D17, D32 is applied to a gate input of the second NFET 128, 132, 136, 140, each having the drain connected to the source of the respective first NFET 126, 130, 134, 138 and each having the source connected to ground.

Dynamic logic circuit 100 includes a pair of clocked, P-channel field effect transistors (PFET) 142, 144 respectively coupled between a supply voltage V and a respective one of two bitline nodes BITLINE 1A, BITLINE 1B. A gate of the PFETs 142, 144 receives a clock signal CLK. The source of the precharge PFETs 142, 144 is connected to the positive supply voltage V. The drain of the respective PFETs 142, 144 is connected to the bitline nodes BITLINE 1A, BITLINE 1B. The precharge PFETs 142, 144 are turned on with low clock cycles to precharge the two bitline nodes BITLINE 1A, BITLINE 1B to a high or one level during the precharge mode. The precharge PFETs 142, 144 are turned off with high clock cycles during the evaluate mode. An inverter 10, 146 having its input connected to BITLINE 1A provides an output labeled OUT.

In operation, when BITLINE 1B begins discharging then inverter I1, 104 activates and turns on N-channel FET 106 which discharges BITLINE 1A which activates inverter I0, 146 making the output OUT go high.

Figure 1:
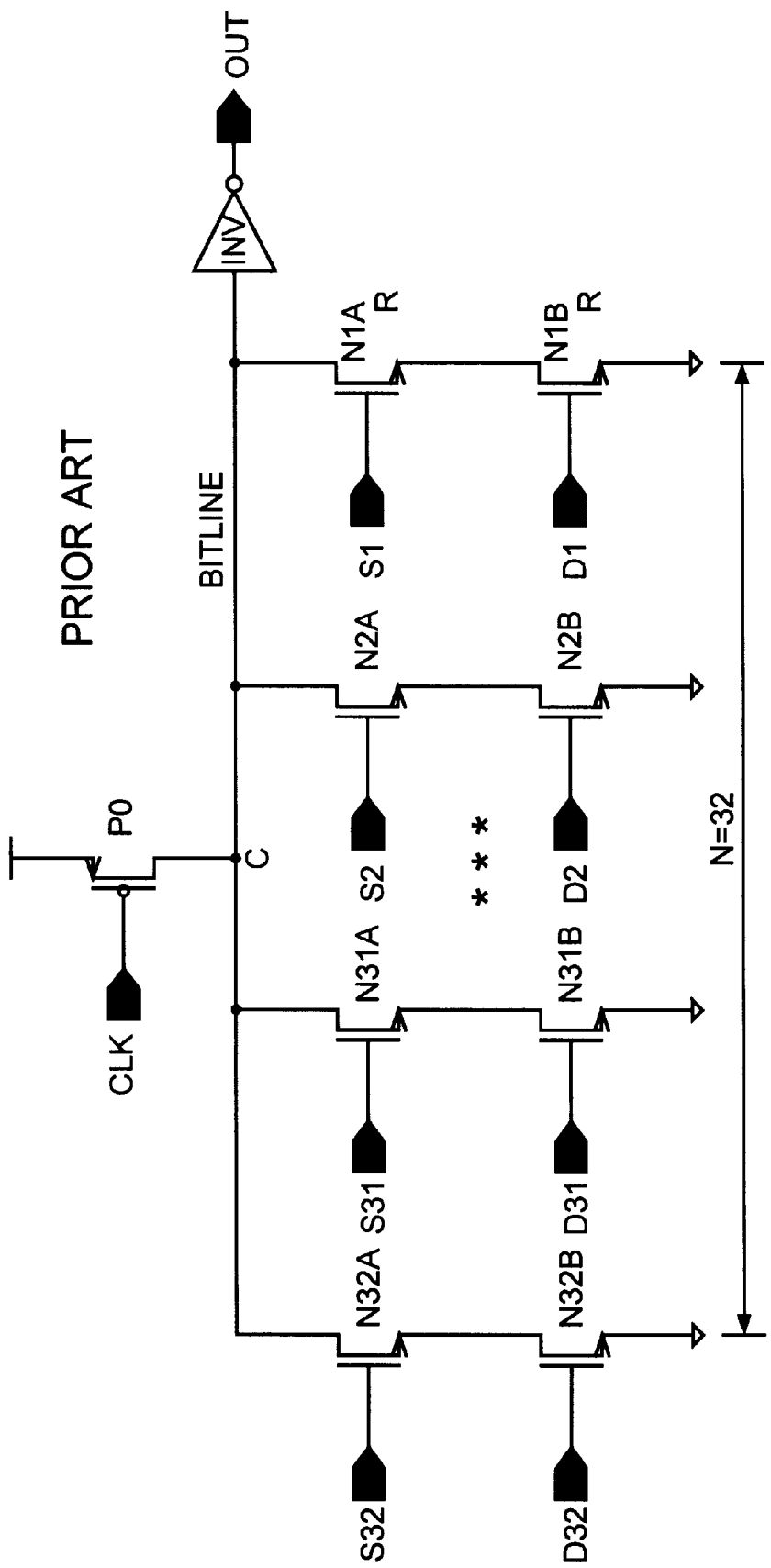
FIG. 1 is a schematic diagram representation of a dynamic bitline circuit.

Inverters 104 AND 146 operates like a conventional bitline of FIG. 1, while providing advantages of reduced delay and decreased power consumption. Delay can be defined as follows:

Delay=BITLINE1B+BITLINE1A=2R*C/2+RC/2+t0=3/2RC+t0, where the delay of inverter I1, 104=t0; and t0−>0.

Dynamic logic circuit 100 of the preferred embodiment has a delay of 3/2 RC versus 2 RC for the conventional dynamic logic circuit of FIG. 1, for a 25% performance increase. Actual hardware shows an improvement of about 20% since t0 is not quite zero. Power can be defined as follows:

Power=(½*C/2V²+½CV²)/2=⅜CV²

Likewise, the invention has a power of ⅜CV² versus a power of ½CV2 for the conventional dynamic logic circuit of FIG. 1, for a decrease in power consumption of 25%. Incredibly, dynamic logic circuit 100 of the preferred embodiment speeds up bitline access while reducing power.

The network nodes BITLINE 1A and BITLINE 1B advantageously share the same wire channel, making application to existing design implemented quite easily. The optional transistor 108 of bitline repeater circuit 102 increases performance slightly by lowering the discharge constant slightly.

Dynamic logic circuit 100 of the preferred embodiment achieves higher performance without increasing transistor sizes. The prior art solution to reduce power dissipation has been to reduce transistor sizes. Dynamic logic circuit 100 also achieves reduced power without reducing transistor sizes. Dynamic logic circuit 100 also achieves better performance without increasing the number of wires.

While the present invention has been described with reference to the details of the embodiments of the invention shown in the drawing, these details are not intended to limit the scope of the invention as claimed in the appended claims.

What is claimed is:

1. A dynamic logic circuit comprising:

a bitline;

said bitline including at least one bitline repeater circuit; each said bitline repeater circuit being inserted at a selected interval along said bitline;

said bitline repeater circuit including an inverter and an N-channel field effect transistor (NFET); and wherein an input of each said inverter is connected at said selected interval along said bitline and an output of each said inverter is connected to the gate of said N-channel field effect transistor (NFET).

2. A dynamic logic circuit as recited in claim 1 wherein a drain of each said N-channel field effect transistor (NFET) is connected at said selected interval along said bitline and a source is connected to ground.

3. A dynamic logic circuit as recited in claim 1 wherein said selected interval along said bitline is at a midpoint of said bitline.

4. A dynamic logic circuit comprising:

a bitline;

said bitline including at least one bitline repeater circuit; each said bitline repeater circuit being inserted at a selected interval along said bitline;

said bitline repeater circuit including an inverter and a transistor; and wherein said inverter is activated by said bitline discharging and said activated inverter turns on said transistor for discharging said bitline.

5. A dynamic logic circuit as recited in claim 4 wherein said bitline repeater further includes a second transistor.

6. A dynamic logic circuit as recited in claim 5 wherein each said second transistor is connected in series with said bitline at said selected interval along said bitline and said second transistor being turned off by said activated inverter.

7. A dynamic logic circuit as recited in claim 5 wherein each said second transistor is a N-channel field effect transistor (NFET) and an output of each said inverter is connected to the gate of said N-channel field effect transistor (NFET).

8. A dynamic logic circuit comprising:

a bitline;

a plurality of series connected pair of transistors connected between said bitline and ground;

said bitline including at least one bitline repeater circuit; each said bitline repeater circuit being inserted at a selected interval along said bitline; and wherein said bitline repeater circuit is inserted at a midpoint of said bitline.

* * * * *